US006656422B2

(12) United States Patent
Masuda

(10) Patent No.: US 6,656,422 B2
(45) Date of Patent: Dec. 2, 2003

(54) DIE-BONDING SOLDER MATERIALS

(75) Inventor: Takashi Masuda, Tokyo (JP)

(73) Assignee: Yamatake Corporation, Tokyo (JP)

( * ) Notice: Subject to any disclaimer, the term of this patent is extended or adjusted under 35 U.S.C. 154(b) by 0 days.

(21) Appl. No.: 09/445,022

(22) PCT Filed: Mar. 29, 1999

(86) PCT No.: PCT/JP99/01586

§ 371 (c)(1),
(2), (4) Date: Nov. 30, 1999

(87) PCT Pub. No.: WO99/50901

PCT Pub. Date: Oct. 7, 1999

(65) Prior Publication Data

US 2003/0143103 A1 Jul. 31, 2003

(30) Foreign Application Priority Data

Mar. 31, 1998 (JP) .............................. 10-83756

(51) Int. Cl.[7] .............................. C22C 13/00
(52) U.S. Cl. ........................................ 420/557
(58) Field of Search ................ 420/562, 557, 420/558, 559, 560, 561

(56) References Cited

U.S. PATENT DOCUMENTS 3,493,367 A * 2/1970 Onuma ...................... 75/175
5,366,692 A * 11/1994 Ogashiwa .................. 420/565
5,690,890 A * 11/1997 Kawashima et al. ....... 420/559

FOREIGN PATENT DOCUMENTS

| JP | 55-16525 | * 2/1980 |
| JP | 55-127027 | 10/1980 |
| JP | 59-135654 | 9/1984 |
| JP | 61-125139 | 6/1986 |
| JP | 63178535 | 1/1987 |
| JP | 63-178535 | 7/1988 |
| JP | 5-259201 | 10/1993 |
| JP | 9-232340 | 9/1997 |

OTHER PUBLICATIONS

"Metals Handbook, Desk Edition, 2nd ed." ASM International: 1998, p 24.*

* cited by examiner

Primary Examiner—Roy King
Assistant Examiner—Janelle Combs Morillo
(74) Attorney, Agent, or Firm—Blakely, Sokoloff, Taylor & Zafman

(57) ABSTRACT

The invention includes a die-bonding solder material having tin and gold. The composition ratio of tin and gold includes a eutectic point defined by having more content of tin than the content of gold. The die-bonding solder material further includes a metal additive having a higher melting point than tin, forming no eutectic with tin, and having a higher eutectic point with gold than the melting point of an eutectic of tin gold.

8 Claims, 6 Drawing Sheets

DIE-BONDING SOLDER MATERIALS

1. TECHNICAL FIELD

The present invention includes to die-bonding solder materials used in die bond for fixing silicon chips or the like onto a base.

2. BACKGROUND ART

As pressure sensors to detect the pressure or the differential pressure, semiconductor pressure transducers using a semiconductor pressure sensor are known (example: Japanese Utility Model Laid-Open No. 59-135654 or the like).

FIG. 9 shows one conventional example of semiconductor pressure transducers 900 equipped with such a semiconductor pressure sensor.

This semiconductor pressure transducer is constructed by installing a base 902 on a carrier 901 and further installing a semiconductor pressure sensor 903 on the base 902.

The carrier 901 is made of an about 0.5 to 3 mm thick metal plate or ceramic plate. A pressure inlet hole 904 is provided at the center, while a conductive pin 906 is inserted near the periphery and hermetically sealed with a seal material 905 such as glass.

The base 902 is formed of an insulating material closely resembling the semiconductor pressure sensor 903 in linear expansion coefficient into a 1 to 5 mm tall cylindrical body. Besides, this base 902 has an insert hole 908 communicating with the above pressure inlet hole 904.

And, to enhance the solderability in joining the base 902 to the carrier 901 by soldering, the carrier 901 and the base 902 are jointed by using a solder material 907 in addition of a gilt simple substance or a nickel-plated simple substance or a product obtained after gilded on its nickel plated surface.

In joining the base 902 to the carrier 901, for example, with ceramic employed for the base 902, the solder material 907 (brazing material) placed between the junction surfaces 901a and 902a of the carrier 901 and the base 902 is heated with a joining jig to melt a solder material 907 for joining after the metallizing according to a conventional well-known method comprising baking Mo, Mn or the like to their joining surfaces 902a and overlapping a Ni or Au plated layer thereon. As a solder material 907, a Sn—Ag series eutectic solder comprising Tin (Sn) and Gold (Au) is used and the thickness of the junction part is set generally to the order of 10 to 50 $\mu$m.

Besides, the semiconductor pressure sensor 903 is made of n-type monocrystal silicon (Si) or the like and has a semiconductor substrate 909 electrostatically joined to the top surface of the base 902. On this semiconductor substrate 909, a strain generating portion about 20 to 100 $\mu$m in thickness or a disk-shaped pressure receiving diaphragm 911 is formed. Besides, on the surface side of the diaphragm 911, four gauges 912 acting as a piezoresistance region is formed by the technique of impurity diffusion or ion implantation. And, a Wheatstone bridge is constituted of these and connected to the conductive pin 906 through a lead wire 913.

3. DISCLOSURE OF THE INVENTION

[Problem to be Solved by the Invention]

Because of being soft, however, the above solder materials 907 were apt to absorb a stress, but for some stationary chips, when the solder materials themselves solidify a stress was given to them to break the above sensor chips or to generate a drift in the measuring result of a sensor.

Besides, the above solder materials 907 were subject to oxidation, could not be preserved in air and therefore were inconvenient in handling.

[Means of Solution to the Problems]

Accordingly, it is the main object of the present invention to suppress the occurrence of a stress to a stationery chip and to enable the chip to be more easily fixed.

To attain such a object, a first invention in the present invention is so arranged that a die-bonding solder material comprises tin and gold and its substantial composition ratio is one which has the eutectic point with a more content of tin than that of gold.

As a result of such a composition, this die-bonding solder material increases in elongation percentage and tensile strength near room temperatures as compared with a solder material made of Sn—Ag eutectic.

Besides, a second invention is so arranged as to add an additive made of a higher metal in eutectic point with gold alone than with both tin and gold, having a higher eutectic point than tin and forming no eutectic with tin, to the die-bonding solder material mentioned in the first invention in addition to tin and gold.

This additive is deposited as a simple substance first in the cooling process of a melting die-bonding solder material.

Besides, a third invention is the second invention with the added amount of an additive ranging from 0.1 to 9% by weight.

Besides, a fourth invention is the second invention with any of antimony, germanium or silicon employed as the additive.

Besides, a fifth invention is the first invention with the eutectic of tin and gold comprising substantially 95% to 90% of tin and 5% to 10% of gold.

4. BRIEF DESCRIPTION OF DRAWINGS

5. BEST MODE OF CARRYING OUT THE INVENTION

Figure 1:
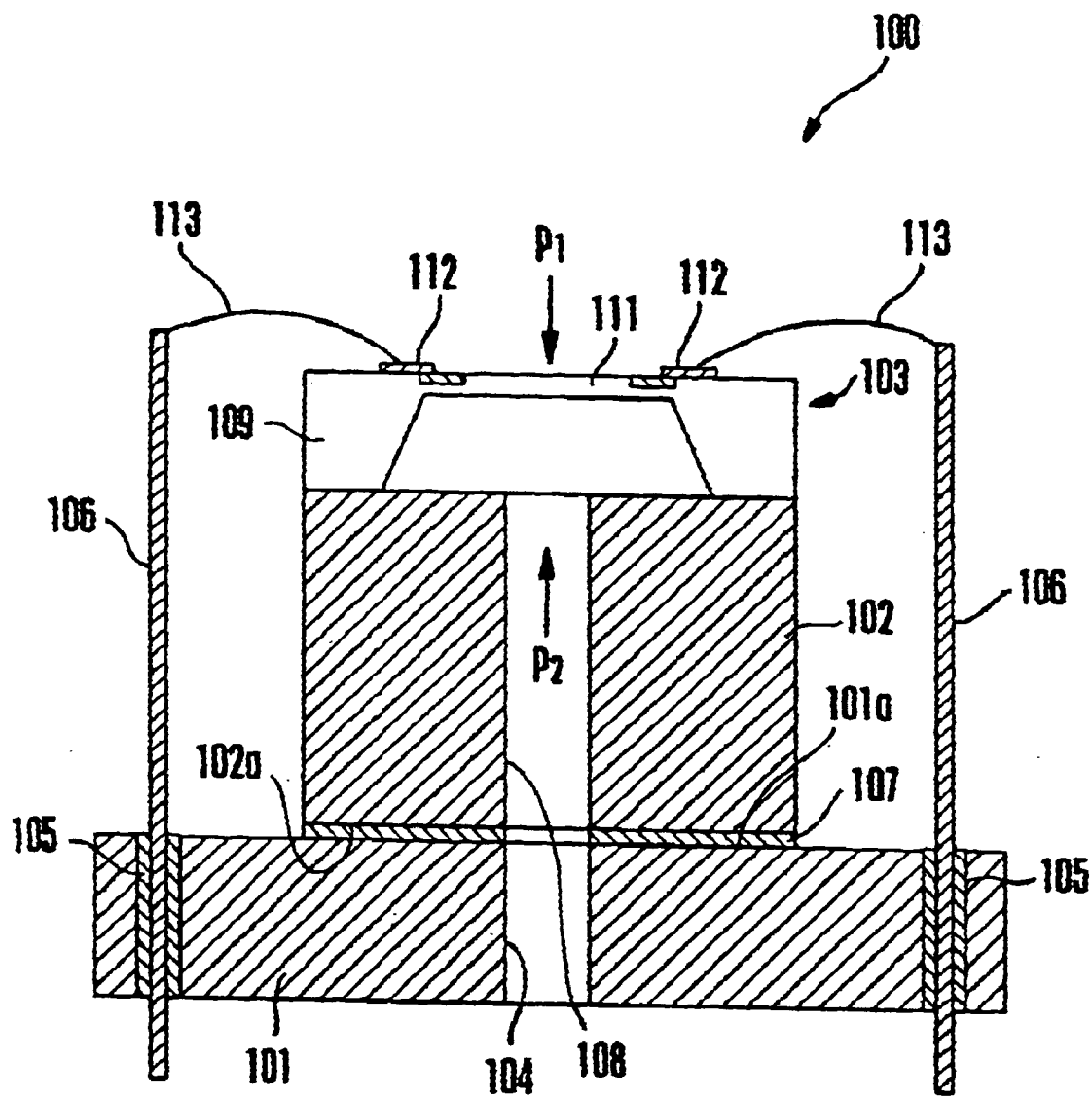
FIG. 1 is a sectional view showing the arrangement of a semiconductor pressure transducer using a die-bonding solder material according to one embodiment of the present invention.

Referring to the drawings, preferred embodiments of the present invention will be described in details below.

(First Embodiment)

FIG. 1 is a sectional view showing the arrangement of a semiconductor pressure transducer 100 using a die-bonding solder material 107 according to one embodiment of the present invention.

Hereinafter, a case of using this inventive die-bonding solder material 107 in manufacturing a semiconductor pressure transducer 100 as shown in FIG. 1 is taken by way of one example to make a description in First Embodiment.

The semiconductor pressure transducer 100 shown in FIG. 1 is configured by installing a base 102 on a carrier 101 and further installing a semiconductor pressure sensor 103 on the base 102.

The carrier 101 is formed in the shape of an about 0.5 to 3 mm thick plate by using 42-alloy, covar or the like. A pressure inlet hole 104 is formed at the center, while a conductive pin 106 is inserted near the periphery and hermetically sealed with a seal material 105 such as glass.

As the base 102, an insulating material closely resembling the semiconductor pressure sensor 103 in linear expansion coefficient is used. This use is because the conduction of a thermal strain generated when joining the semiconductor pressure base 102 to the sensor 103 deteriorates the temperature characteristics of a transducer, thus resulting in a zero-point shift. And, examples of such insulating materials include pyrex glass (trade name) and ceramics. And, this base 102 is formed into an about 1 to 5 mm tall cylindrical body and has an insert hole 108 communicating with the pressure inlet hole 104.

Meanwhile, since the carrier 101 is of 42-alloy or covar, the base 102 can be soldered directly thereto. Generally, to enhance the solderability, however, the carrier 101 and the base 102 are jointed by using a solder material 107 with a gilt simple substance or a nickel-plated simple substance or a product obtained after gilded on its nickel plated surface added.

In joining the base 102, for example, made of ceramic, to the carrier 101, the solder material (brazing material) 107 placed between the junction surfaces 101a and 102a of the carrier 101 and the base 102 is heated with a joining jig to melt a solder material 107 for joining after the metallizing according to a conventional well-known method, for example, comprising baking Mo, Mn or the like to their junction surfaces 102a of the base 102 and overlapping a nickel(Ni)- or gold(Au)-plated layer thereon.

And in First Embodiment, as a solder material 107, an Sn-An series eutectic solder comprising Sn and Au is used and its substantial composition ratio is so arranged as having an eutectic point (approx. 217° C.) with a more content of Sn than that of Au. For this purpose, it is only necessary to choose an eutectic crystal with a composition ratio (weight ration) of approx. 90% to approx. 10% between Sn and Au, for example. Incidentally, the thickness of the junction part is set generally to the order of 10 to 50 µm.

Besides, the semiconductor pressure sensor 103 is made of n-type monocrystal silicon (Si) or the like and has a semiconductor substrate 109 electrostatically joined to the top surface of the base 102.

On this semiconductor substrate 109, a strain generating portion about 20 to 100 µm in thickness or a disk-shaped pressure receiving diaphragm 111 is formed by eliminating the central back face by means of etching. Besides, on the surface side of the diaphragm 111, four gauges 112 operating as a piezoresistance region is formed by the technique of impurity diffusion or ion implantation. And, a Wheatstone bridge is constituted of these 4 gauges 112 and connected to the conductive pin 106 through a lead wire 113.

On applying measuring pressures P1 and P2 respectively to the front and back surface of a pressure receiving diaphragm 111 in such an arrangement, the pressure receiving diaphragm 111 is deformed depending on their difference pressure ΔP(=P1−P2), thereby causing a change in specific resistance of a gauge 112. Thus, by detecting the output voltage accompanying the change of this time in specific resistance, the difference pressure ΔP can be measured. Incidentally, in using the gauge for the detection of a difference pressure, the pressure inlet hole 104 is opened to the atmosphere and a measuring pressure P1 is applied to the diaphragm 111.

And as mentioned above, since the carrier 101 and the base 102 are so arranged as to be joined by using a solder material 107, the generation of a strain originating from the solder material 107 with a temperature change in the soldering junction becomes preventable.

Here, from a comparison between the eutectic of Sn and Au used as a solder material according to First Embodiment and that of Sn and Ag used as a conventional solder material on various characteristics, the results shown below in Table 1 are obtained.

TABLE 1

| | Thermal Expansion Coefficient (/° C.) | Melting Point (° C.) | Young Ratio (MPa) | Elongation Percentage near Room Temperature | Tensile Strength near Room Temperature (MPa) |
|---|---|---|---|---|---|
| SnAu Eutectic | 136 × 10⁻⁷ | 217 | 5610–6850 | 33 | 58 |
| SnAg Eutectic | 142 × 10⁻⁷ | 221 | 5660–21600 | 18 | 35 |

Here, in First Embodiment, the deformation due to a temperature change during the soldering with a solder material 107 in the joining of the carrier 101 and the base 102 comprises an elastic deformation and a plastic deformation occurring at the same time. And, the breakage of a chip during the soldering originates from the elastic deformation. Besides, a drift occurring after the soldering originates from the plastic deformation. This elastic deformation is affected by the young ratio of a solder material and the plastic deformation is affected by the hardness and the elongation percentage of a soldering material.

Accordingly, as evident from the comparison of Table 1, use of a solder material according to First Embodiment is found to be better to suppress the breakage of a chip and the drift in a sensor by the soldering.

Here, in accordance with the Hook's law, a stress generated by the soldering becomes smaller as shown in Expression 1 when using an Sn—Au eutectic according to First Embodiment than when using an Sn—Ag eutectic. Incidentally, this holds true of a case of soldering under conditions such as thermal treatment where the maximum effect is obtained.

$$\{(\alpha 1 - \alpha g) \times T_{melt1} \times E1\} / \{(\alpha 2 - \alpha g) \times T_{melt2} \times E2\} \quad \text{[Equation 1]}$$

$$= \{(136 - 30) \times (217 - 25) \times 5610\}$$

$$/ \{(146 - 30) \times (221 - 25) \times 2160\}$$

$$= 0.23$$

Herein, α1, α2 and αg are the thermal expansion coefficient of an Sn—Au eutectic according to First Embodiment, that of an Sn—Ag eutectic and that of a material to be joined, respectively. Besides, $T_{melt1}$ and $T_{melt2}$ are a temperature difference between a room temperature (25° C.) and the melting point in an Sn—Au eutectic according to First Embodiment and in an Sn—Ag eutectic. And, E1 and E2 are the Young ratio of an Sn—Au eutectic according to First Embodiment and that of an Sn—Ag eutectic.

Meanwhile, in First Embodiment, a solder material 107 had a composition ratio between Sn and Au set to that of approx. 90% to approx. 10%, but the composition ratio need not always to be set to this value. If a target to be joint by soldering contains Au, for example, with the composition ratio of a die-bonding solder material set to Sn—Au=9:1 as mentioned above, Au diffuses from the target toward the solder material, thus resulting in a deviation of the composition ratio of the solder material from 9:1. In such a case, it is advisable to reduce the composition ratio of Au in advance and to set it to the order of Sn:Au=95:5 at the maximum.

Namely, such an arrangement would be best that the composition "Sn:Au" of a die-bonding solder material is variable in a range of "9:1 to 95:5" depending on the containing condition of Au in a target to be joined by soldering and the die-bonding solder material is an Sn—Au eutectic with the substantial composition ratio having an eutectic point in a greater composition ratio of Sn than that of Au.

(Second Embodiment)

In case of using an Sn—Au eutectic as mentioned above with the substantial composition ratio having an eutectic point in a greater composition ratio of Sn than that of Au as a solder material, there are cases where too long cooling of a solder leads to the deterioration of soldering performances. This is attributable to the denaturation of the solder comprising Sn and Au. With an eutectic point in a greater composition ratio of Sn than that of Au or in a composition ratio of almost 9 to 1, crystals of an intermetallic compound between Sn and Au greatly grow and grains of these crystals becomes too great in size on long cooling the solder material after once melted. And, in large-sized crystal grains, the linear expansion coefficient increase, thus turning the solder hard and fragile.

Thus, Second Embodiment is so arranged that Sb is added to the above solder material of First Embodiment in a range of 0.1 to 9.0 wt. % as an additive. By the addition of Sb like this, the excessive growth of crystal grains of an intermetallic compound between Sn and Au is prevented, thereby leading to the formation of only more minute crystal grains.

This seems to be because an addition of Sb disables the diffusive centralization of Au in a fused solder.

Figure 2:
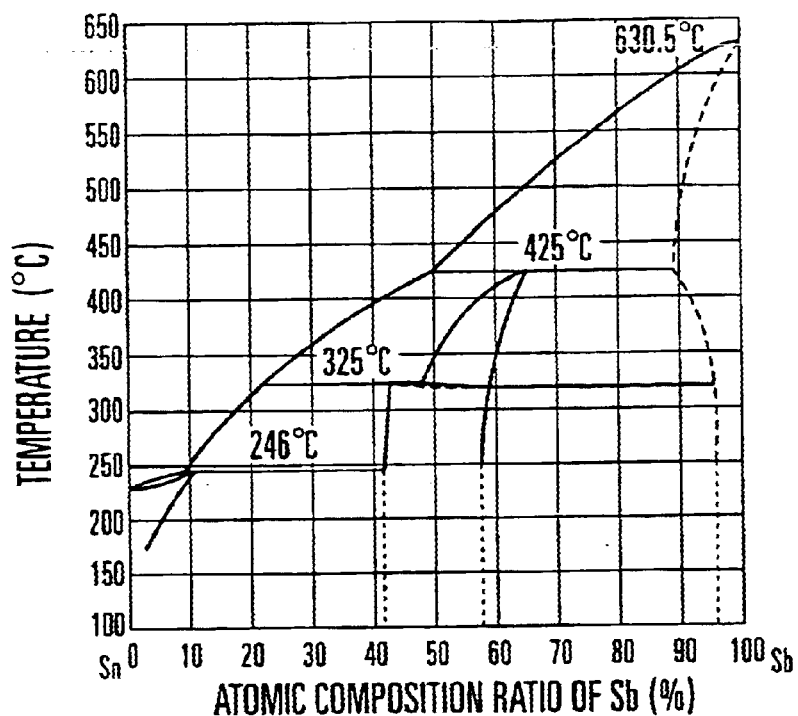
FIG. 2 is a phase diagram of Sn—Sb.

First, since Sn—Sb has no eutectic point as shown in the phase diagram of FIG. 2, a solder material made of an Sn—Au eutectic with the substantial composition ratio having an eutectic point in a greater composition ratio of Sn than that of Au comes to have a liquids temperature of not lower than 232° C., melting point of Sn if Sb contained.

Figure 3:
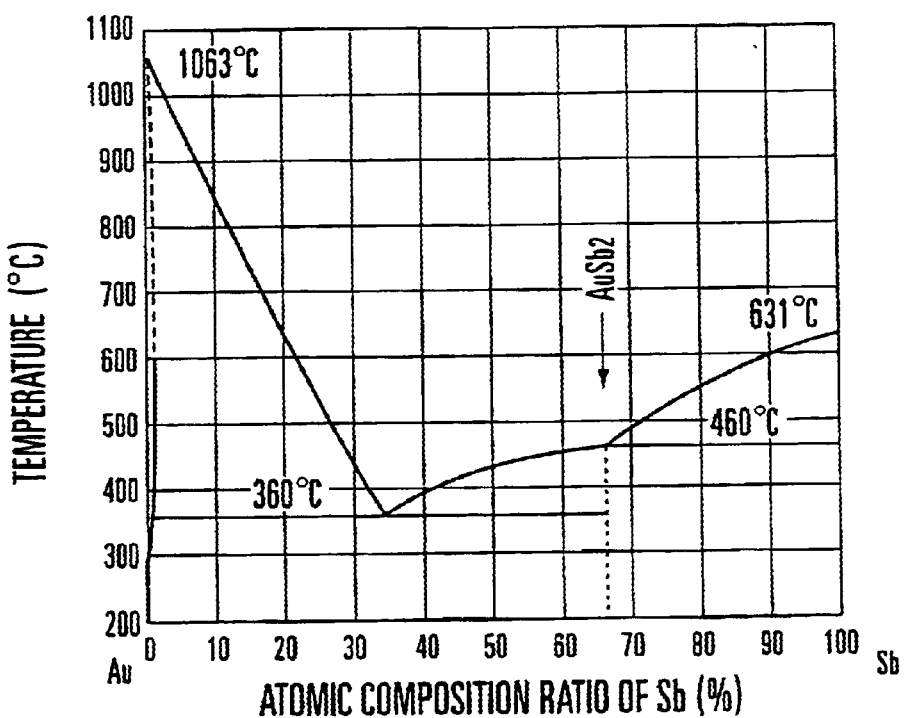
FIG. 3 is a phase diagram of Au—Sb.
Figure 4:
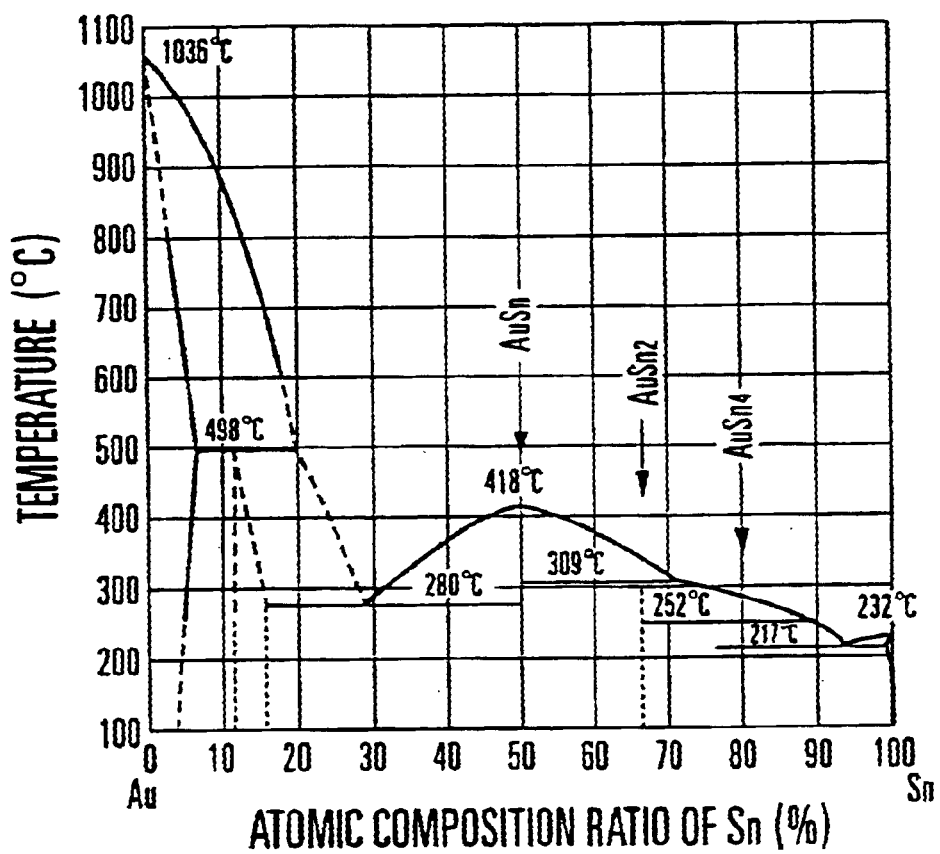
FIG. 4 is a phase diagram of Au—Sn.

Besides, as shown in the phase diagram of FIG. 3, the eutectic point of Au—Sb is 360° C., while the eutectic point of Sn—Au in this solder material is 217° C. as shown in the phase diagram of FIG. 4.

Here, first, account will be taken of a process that a solder made of an Sn—Au eutectic with the substantial composition ratio having an eutectic point in a greater composition ratio of Sn than that of Au gradually cools after the fusion.

When the temperature comes near the eutectic point of Sn—Au in the relevant cooling process, a intermetallic compound $AuSn_x$ composed at a certain composition ratio is formed. And, when the temperature distribution inside the solder is uniform and the cooling temperature is extremely slow in this cooling process, a value of x changes as 1→2→4 while an equilibrium state between deposition and fusion formed. Finally, the intermetallic compound forms an eutectic structure with Sn in the state of $AuSn_4$ to transit into a solid phase.

During the cooling, however, since the temperature is not constant, a perfect equilibrium is not actualized and the intermetallic compound of Sn—Au shifts from the equilibrium between the fusion state and the deposition state a little to the side of the deposition state. Namely, the intermetallic compound of Sn—Au floats in the surrounding fused solder at the solid shifting to the side of the solid phase.

In this case, a temperature difference takes place in the solder owing to the transient state of cooling. In the cooling process, since heat dissipates from the surface of a fused solder, the temperature of a fused peripheral portion is always lower than that of a solid intermetallic compound present inside. For this reason, even if the temperature of a solder is not cooled to the eutectic point of Sn—Au, solid Sn—Au intermetallic compounds are newly formed and associated with an Sn—Au intermetallic compound already formed while floating through the liquid phase to be bonded to it by a cohesive force. As a result, crystal grains of the intermetallic compound of $AuSn_4$ grows too much in size. And, if the crystal size of this intermetallic compound becomes too great, the linear expansion coefficient increases in a cooled and solidified solder, thus turning the solder hard and fragile as mentioned above.

Here, let a 9 wt. % contained condition of Sb in the above solder material be considered. Cooling gradually proceeds after the fusion of this solder. First, when the temperature of the solder reaches 246° C. in the cooling process, Sb is allowed to be deposited as a simple substance in the liquid phase of the fused solder along the curve of the liquids temperature of Sn—Sb as shown in FIG. 2. The reason for this is as follows. Primarily because the above temperature is below the eutectic point 360° C. of Au—Sb as mentioned above, the fused state of Sb cannot be kept at that temperature even for any composition ratio between Au and Sb. Secondly because the eutectic point of Sn—Au is 217° C. for this solder, Au is in the fused state at a temperature 246° C. Namely, a solid solution of Au—Sn or an intermetallic compound is not deposited in solid. Thirdly, because a mixture of Sn and Sb form no eutectic and has no eutectic point as shown in FIG. 2, Sn alone is fused and deposited near 246° C. in accordance with the phase diagram of FIG. 2.

Then, with a further cooling, crystal grains of an intermetallic compound of Sn and Au is successively formed as mentioned above, but now the presence of Sb deposits hinder the floating of a formed intermetallic compound through the liquid phase. As a result, a chance of mutual association for crystal grains of the intermetallic compound of Sn and Au formed in the cooling process decreases, thereby inhibiting the excessive growth of crystal grains. Since Sb is singly deposited near and above the eutectic point of Sn—Au as mentioned above, crystal grains of an intermetallic compound of Sn and Au can be prevented from moving through the liquid phase.

Since a die-bonding solder material according to Second Embodiment is so arranged as to add Sb as described above, Sb is allowed to be deposited in a simple substance at the deposition initiating temperature of an intermetallic compound of Sn and Au even if a gradual cooling solidification is made in the soldering process. As a result of this, since crystal grains of an intermetallic compound of Sn and Au can be prevented from growing too much in size, the deterioration of performances in a die-bonding solder material shown in First Embodiment becomes inhibitable.

Here, if the addition of Sb is not smaller than 0.1 wt. %, the above effect is obtained. However, for the addition of higher than approx. 10 wt. % Sb, the Sn—Au solder material becomes fragile and hard and deteriorates in stress relaxing mechanism, the addition of an additive has only to be set below approx. 10 wt. %.

Incidentally, in Second Embodiment, Sb was so arranged as to be added, but the present invention is not limited to this and even an arrangement of adding Si or Ge enables the same effect to be obtained as with the addition of Sb.

Figure 5:
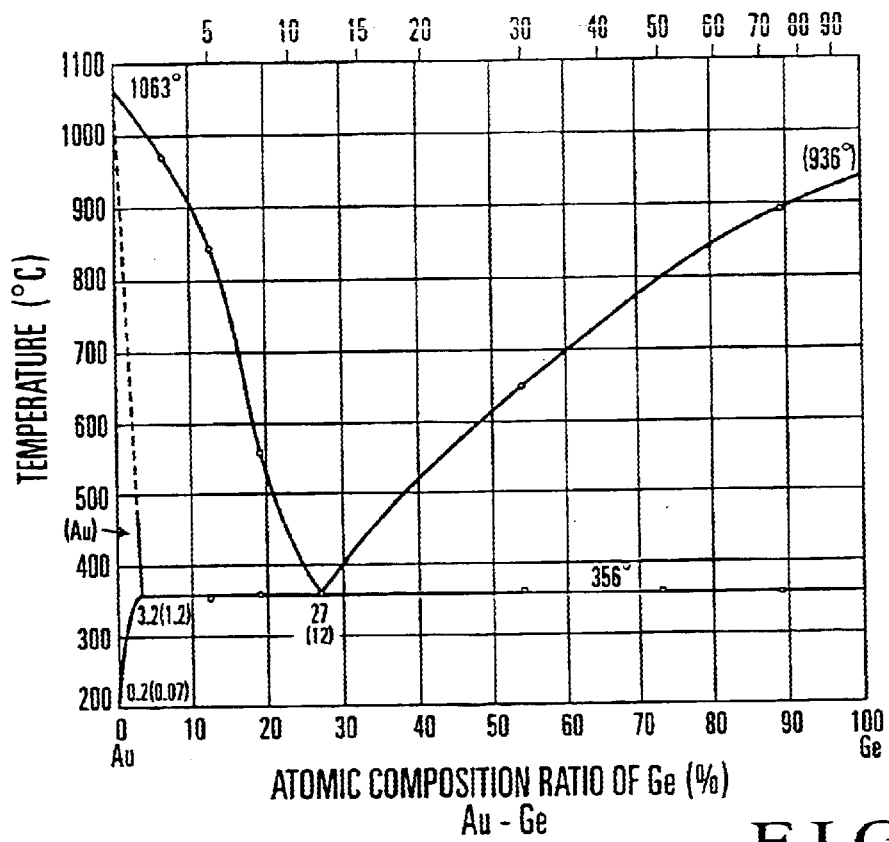
FIG. 5 is a phase diagram of Au—Ge.
Figure 6:
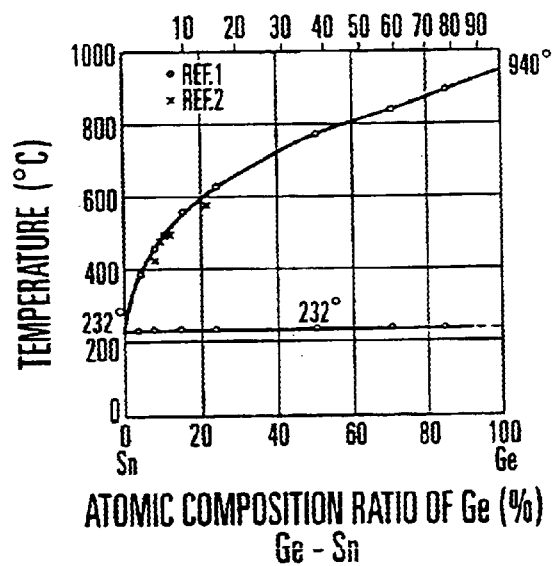
FIG. 6 is a phase diagram of Ge—Sn.

First, as shown in FIG. 5, the eutectic point of Au—Ge is 356° C. and moreover Ge—Sn forms no eutectic and has no eutectic point. And, in a higher temperature region than 217° C., the above-mentioned eutectic point of Sn—Au, Ge is allowed to be deposited as a simple substance in the liquid phase of a fused Sn—Au solder along the curve of the liquids temperature of FIG. 6 in presence of Ge in an Sn—Au solder material.

Figure 7:
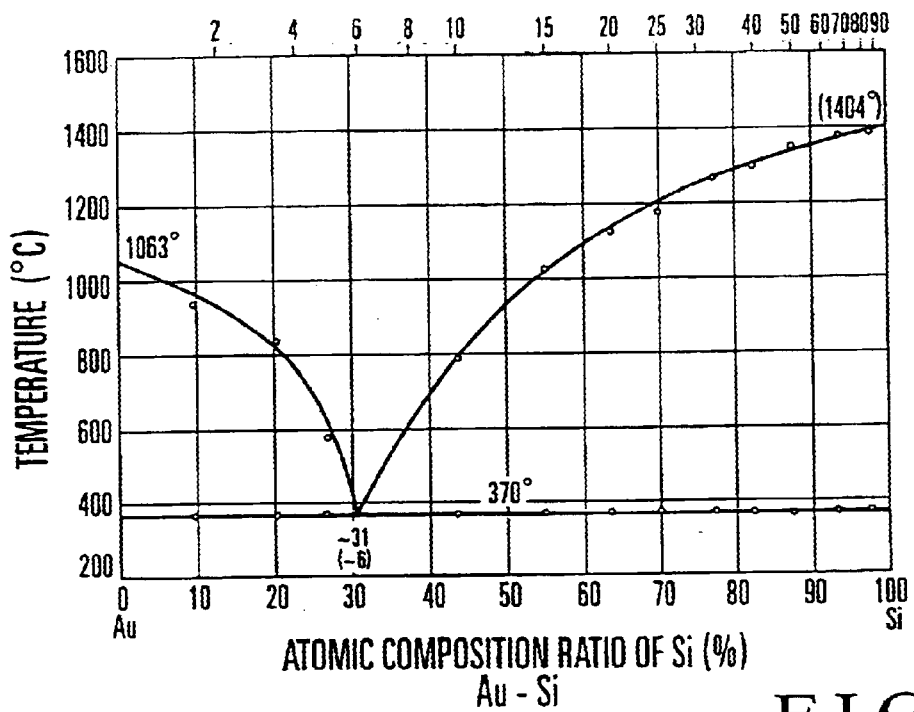
FIG. 7 is a phase diagram of Au—Si.
Figure 8:
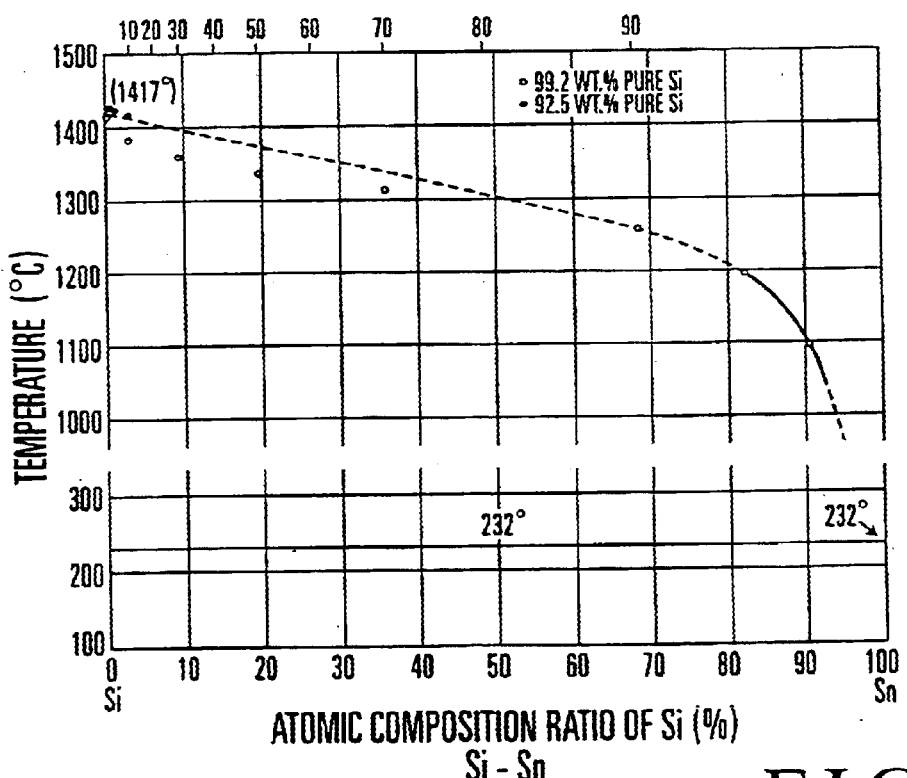
FIG. 8 is a phase diagram of Si—Sn.
Figure 9:
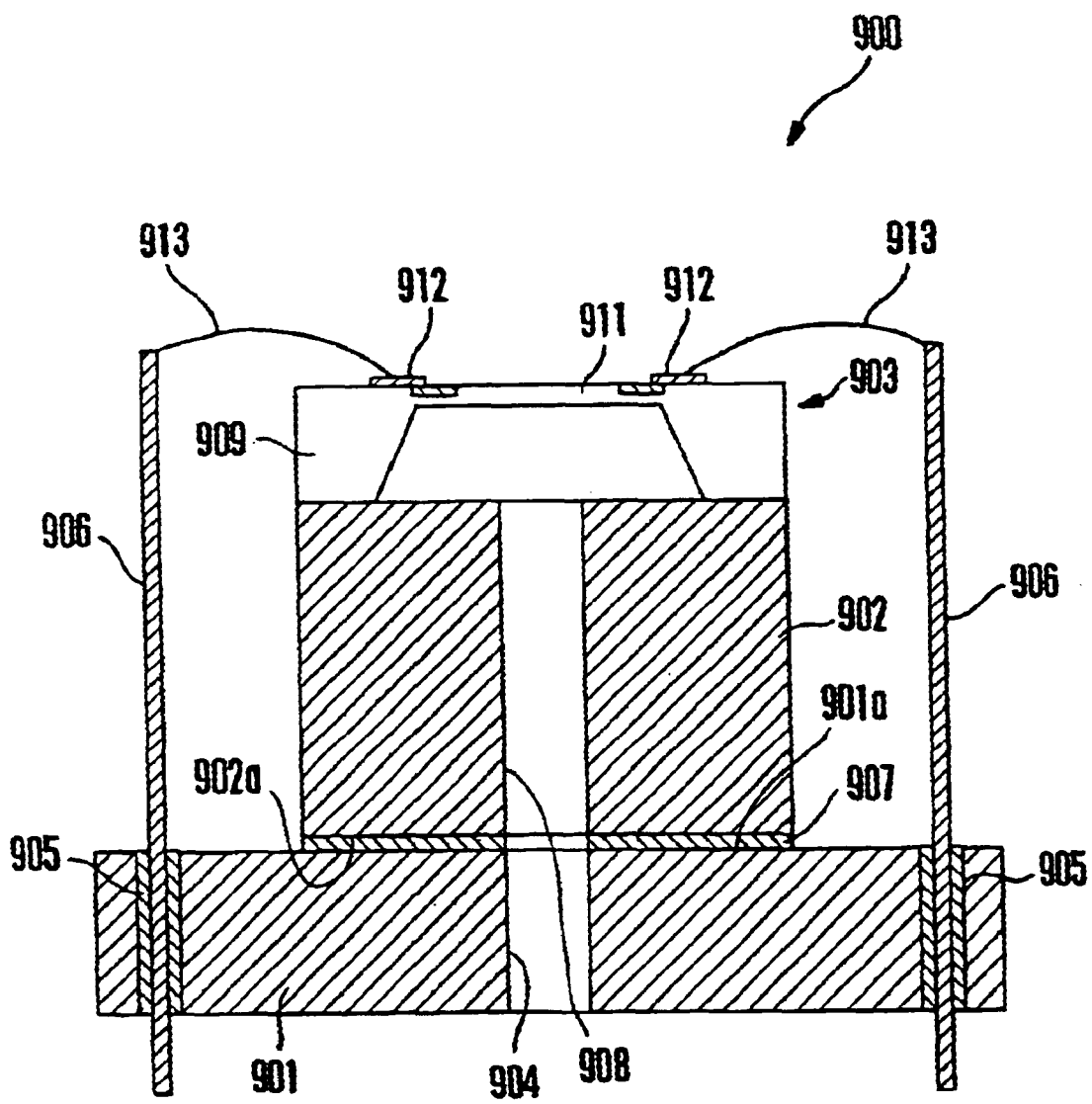
FIG. 9 is a sectional view showing the arrangement of a semiconductor pressure transducer using a conventional die-bonding solder material.

Besides, as shown in FIG. 7, the eutectic point of Au—Si is 370° C. and moreover as shown in FIG. 8 Si—Sn forms no eutectic and has no eutectic point. And also in this case, in a higher temperature region than 217° C., the above-mentioned eutectic point of Sn—Au, Si is allowed to be deposited as a simple substance in the liquid phase of a fused solder along the curve of the liquids temperature of FIG. 8 in the presence of Si in an Sn—Au solder material.

Thus, regardless of whether Ge or Si, the addition of them enables the same effect to be obtained as with the above addition of Sb.

Here, as evident from the above description, according to the present invention, the first invention is composed of tin and gold with such a substantial composition ratio as having the eutectic point with a more content of Sn than that of Au.

As a result of such a composition, with a die-bonding solder material according to the present invention in contrast to the use of a solder material made of an Sn—Ag eutectic, the elongation percentage near room temperature increases, the Young ratio and the linear expansion coefficient are small, so that a stress to a stationery chip can be made less likely to occur than conventional. Besides, a high bonding strength is obtained because of a high tensile strength and moreover the content of gold gives an excellent oxidation resistance and permits this die-bonding solder material to be used free of flux in the soldering joining.

Besides, the second invention is the first invention so arranged as to add an additive made of a metal higher in melting point than tin, forming no eutectic with tin and having a higher eutectic point with gold than the above melting point of an eutectic of tin and gold. This additive metal is added addition to tin and gold to the above die-bonding solder material. This additive is deposited first as a simple substance in the cooling process of a fused die-bonding solder material and accordingly can inhibit the formation of large crystal grains, thereby enabling the deterioration of joining performances with a solder to be inhibited.

Besides, the third invention is the second invention with the added amount of an additive ranging from 0.1 to 9% by weight. This additive is deposited first as a simple substance in the cooling process of a fused die-boding solder material and accordingly can inhibit the formation of large crystal grains, thereby enabling the deterioration of joining performances with a solder to be inhibited.

Besides, a fourth invention is the second invention with any of antimony, germanium or silicon employed as the additive. This additive is deposited first as a simple substance in the cooling process of a fused die-boding solder material and accordingly can inhibit the formation of large crystal grains, thereby enabling the deterioration of joining performances with a solder to be inhibited.

Besides, a fifth invention is the first invention with the eutectic of tin and gold comprising substantially 95% to 90% of tin and substantially 5% to 10% of gold. As a result of this, with a die-bonding solder material according to the present invention in contrast to the use of a solder material made of an Sn—Ag eutectic, the elongation percentage near room temperature increases, the Young ratio and the linear expansion coefficient are small, so that a stress to a stationery chip can be made less likely to occur than conventional. Besides, a high bonding strength is obtained because of a high tensile strength and moreover the content of gold gives an excellent oxidation resistance and permits this die-bonding solder material to be used free of flux in the soldering joining.

What is claimed is:

1. A die-bonding solder material comprising:

tin;

gold, wherein a composition ratio of tin and gold includes a eutectic point having 90 to 95 percent by weight tin;

a metal additive having a higher melting point than tin, forming no eutectic with tin, and having a higher eutectic point with gold than the melting point of an eutectic of tin gold;

wherein the metal additive ranges from 0.1 to 9% by weight of the tin-gold-metal additive composition; and wherein the metal additive is germanium.

2. A die-bonding solder material consisting of:

tin;

gold, wherein a composition ratio of tin and gold include a eutectic point having 90 to 95 percent by weight tin; and a metal additive having a higher melting point than tin, forming no eutectic with tin, and having a higher eutectic point with gold than the melting point of an eutectic of tin and gold;

wherein the metal additive ranges from 0.1 to 9% by weight of the tin-gold-metal additive composition; and wherein the metal additive is silicon.

3. The die-bonding solder material of claim 2, wherein an amount of said metal additive included in the tin-gold-metal additive composition is deposited such that excessive growth of crystal grains is suppressed during cooling process.

4. The die-bonding solder material of claim 2, wherein the metal additive is deposited during cooling of the tin-gold composition in liquid phase to suppress excessive growth of crystal grains.

5. A die-bonding solder material consisting essentially of:

tin;

gold, wherein a composition ratio of tin and gold include a eutectic point having 90 to 95 percent by weight tin;

a metal additive having a higher melting point than tin, forming no eutectic with tin, and having a higher eutectic point with gold than the melting point of an eutectic of tin and gold, wherein the metal additive ranges from 0.1 to 9% by weight of the tin-gold-metal additive composition, wherein the metal additive is silicon; and wherein the die-bonding solder material is used for bonding components of a pressure transducer.

6. The die-bonding solder material of claim 5, wherein an amount of said metal additive included in the tin-gold-metal additive composition is deposited such that excessive growth of crystal grains is suppressed during cooling process.

7. The die-bonding solder material of claim 5, wherein the metal additive is deposited during cooling of the tin-gold composition in liquid phase to suppress excessive growth of crystal grains.

8. A die-bonding solder material consisting essentially of:

tin;

gold, wherein a composition ratio of tin and gold include a eutectic point having 90 to 95 percent by weight tin;

a metal additive having a higher melting point than tin, forming no eutectic with tin, and having a higher eutectic point with gold than the melting point of an eutectic of tin and gold, wherein the metal additive ranges from 0.1 to 9% by weight of the tin-gold-metal additive composition, wherein the metal additive is silicon; and wherein the die-bonding solder material is used for bonding components of a pressure transducer, the pressure transducer including a pressure sensor, a carrier and a base coupled between the pressure sensor and the carrier, wherein the die-bonding solder material is used to bond the base to the carrier.

* * * * *